(12) United States Patent  (10) Patent No.: US 8,381,395 B2
Bachthaler et al.  (45) Date of Patent: Feb. 26, 2013

(54) METHOD FOR DETERMINING PICK-UP POSITIONS OF ELECTRONIC COMPONENTS

(75) Inventors: Thomas Bachthaler, Stockdorf (DE); Hans-Horst Grasmueller, Mammendorf (DE); Thomas Liebeke, Ottobrunn (DE); Michael Schwiefert, Augsburg (DE)

(73) Assignee: ASM Assembly Systems GmbH & Co. KG, Munich (DE)

( * ) Notice: Subject to any disclaimer, the term of this patent is extended or adjusted under 35 U.S.C. 154(b) by 1331 days.

(21) Appl. No.: 11/323,415

(22) Filed: Dec. 30, 2005

(65) Prior Publication Data

US 2006/0133662 A1 Jun. 22, 2006

Related U.S. Application Data

(62) Division of application No. 10/220,535, filed as application No. PCT/DE01/00740 on Feb. 28, 2001, now abandoned.

(30) Foreign Application Priority Data

Mar. 1, 2000 (DE) .................................. 10009765

(51) Int. Cl.
*H05K 3/30* (2006.01)

(52) U.S. Cl. ............................ 29/834; 29/833; 206/724
(58) Field of Classification Search .................. 206/716, 206/724; 294/139; 414/222.02; 901/10, 901/46, 47; 29/720, 721, 739, 740, 759, 29/760, 832–833
See application file for complete search history.

(56) References Cited

U.S. PATENT DOCUMENTS

| 4,610,083 | A | * | 9/1986 | Campisi et al. ................. 29/832 |
| 4,810,154 | A | | 3/1989 | Klemmer et al. |
| 5,361,901 | A | * | 11/1994 | Schenz et al. ................. 206/714 |
| 5,463,227 | A | | 10/1995 | Stern et al. |
| 5,648,136 | A | * | 7/1997 | Bird ............................. 206/716 |
| 5,913,425 | A | * | 6/1999 | Thomas et al. ................ 206/725 |
| 5,988,394 | A | | 11/1999 | Emoto et al. |
| 6,154,957 | A | | 12/2000 | Tsubouchi et al. |

FOREIGN PATENT DOCUMENTS

DE  196 10 126  9/1997

\* cited by examiner

*Primary Examiner* — Donghai D. Nguyen
(74) *Attorney, Agent, or Firm* — Schiff Hardin LLP

(57) ABSTRACT

A device and appertaining method for picking up devices in a component placement device permits even very small components and even a first component of a new belt to be picked up by scanning the structural features of the belt directly in the proximity of the components. The positional tolerances can be disregarded so that even the first component of a new belt can be reliably detected by the pick-up tool.

14 Claims, 1 Drawing Sheet

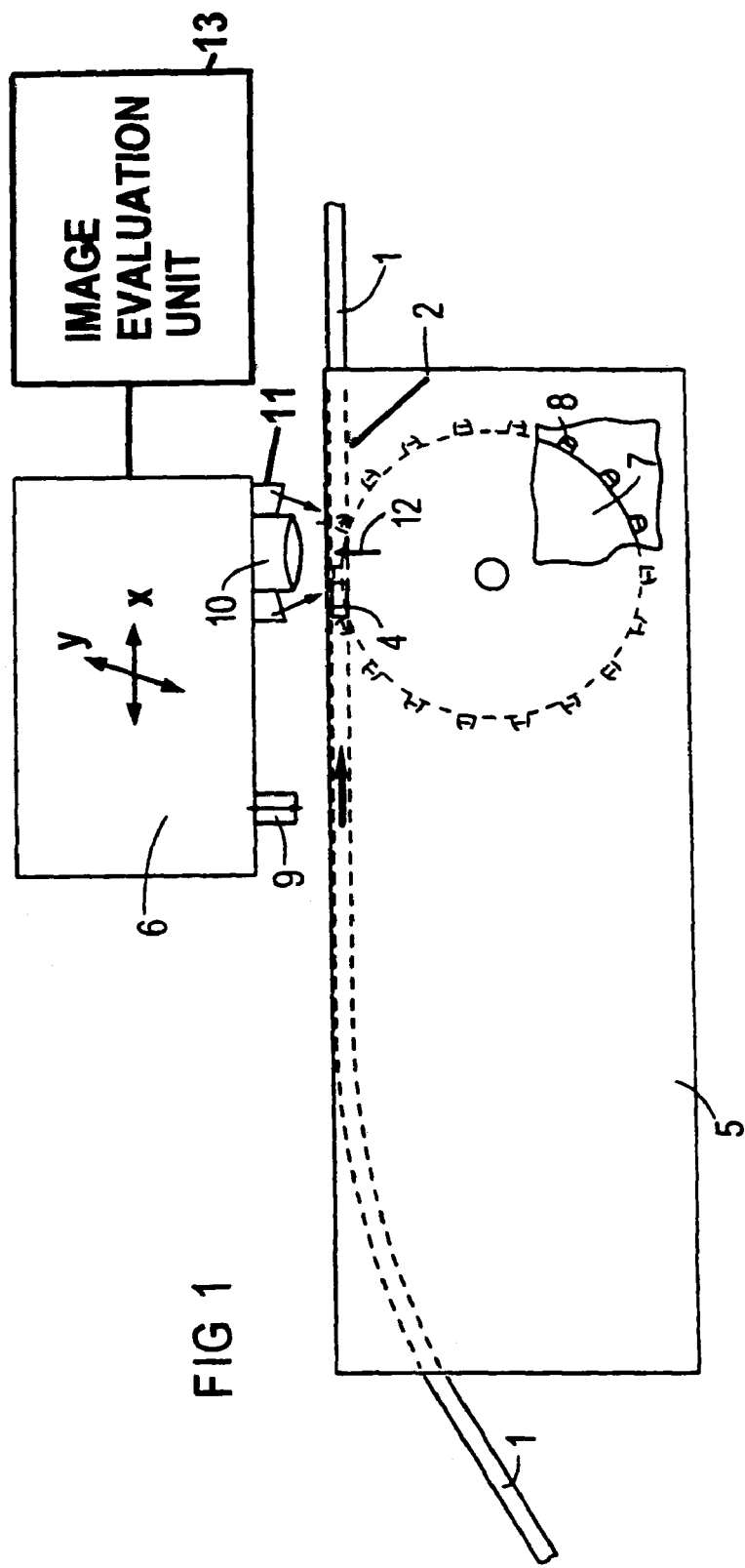
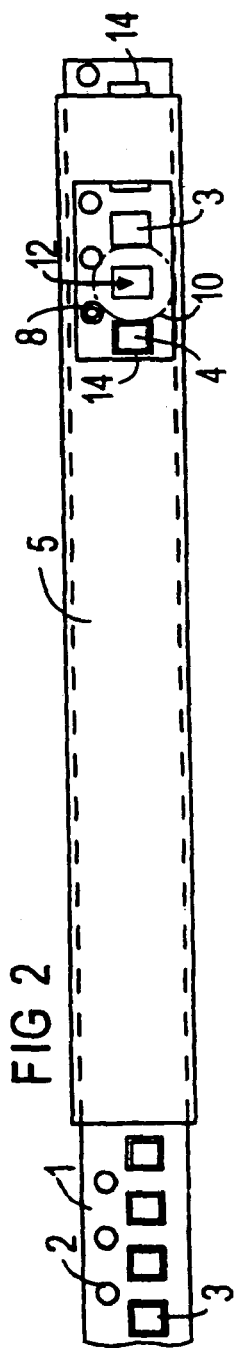

METHOD FOR DETERMINING PICK-UP POSITIONS OF ELECTRONIC COMPONENTS

CROSS-REFERENCE TO RELATED APPLICATIONS

This Application is a divisional of parent application Ser. No. 10/220,535, filed Feb. 20, 2003, now abandoned, which is a national stage entry of International Patent Application No. PCT/DE01/00740, filed Feb. 28, 2001. The parent application is herein incorporated by reference.

BACKGROUND OF THE INVENTION

1. Field of the Invention

The invention relates to a method for determining the pick-up position of electrical components in a component placement device for populating substrates with the components, which are made ready in pockets of at least one belt, the belt being inserted into a feed module which delivers the components to a pick-up point in a defined pick-up position.

2. Description of the Related Art

Feed modules of this type are usually provided with a pin wheel which, with its radially projecting pins, engages in transport holes in the belt and which is rotated in defined angular steps corresponding to the pitch spacing of the pockets in the belt. The pockets have a defined positional relationship with the transport holes. Centering marks are fitted to the feed modules at the end of the production process, in the area of the pick-up point, which have a defined positional relationship with the pins of the pin wheel and which are intended to compensate for production tolerances.

The feed modules are fixed in a defined position to a component table. Since the centering mechanism for this purpose can be provided only at some distance from the pick-up points, it is possible for positional deviations to occur in the centering marks. A component placement head for handling the components is provided with the CCT camera, which is used to determine the exact position of the substrate to be populated in the component placement device. In order to be able to take into account the previously mentioned positional deviations, it is usual, following the installation of the feed module, to determine the position of the centering marks on the feed module using this printed circuit board camera, with which, because of the defined positional relationships, the position of the component to be picked up can also be determined. Deviations in the drive system caused by operation cannot be eliminated completely in this case.

In the course of modern technologies, the components to be placed are being increasingly miniaturized. It is usual to provide the component placement head with a suction gripper, which is set down on the components to be picked up and which sucks up a component at its end. Here, the gripper has to dip into the pocket in order to be placed on the component. The permissible tolerances between the transport hole and the pocket are so great that the suction gripper making the pick-up cannot with certainty be set exactly onto the component to be picked up; it is placed on the edge of the pocket and, as a result, may miss the component. In this case, however, this is a systematic error, at least over a relatively long section of the belt.

It is usual, in the case of each of the components picked up, to measure their position with respect to the suction gripper and to place the component onto the substrate with a corresponding correction value. In order to be able to determine the systematic error, at least after a belt change, a series of components is removed from the start of the belt and measured, and an average deviation is determined. However, this is a problem when the component is not found during the first attempt at a pick-up. The gripper then has to be moved step by step over the previously mentioned tolerance range until it finds the component.

Furthermore, U.S. Pat. No. 6,154,957 discloses a component placement device with a component placement head to which a camera pointing toward the pick-up points of the components is fixed. According to column 3, lines 15 to 19, this camera is used to detect optically the components lying in the pockets in the belt and to detect their pick-up position. Since, in this case, each positionally critical component is obviously measured before being picked up, the highest possible hit reliability is achieved. Since the camera and the respective suction pipette are at a distance from each other, the component placement head in each case has to be positioned at two different coordinate points in two steps, which is time consuming. A further disadvantage is that the pocket is normally temporarily covered at the removal point by a movable covering slider, whose actuation reduces the time interval for the scanning and the removal.

SUMMARY OF THE INVENTION

The invention is based on the object of accelerating the determination of the pick-up position of the components.

This object is achieved by a method for determining the pick-up position of electrical components in a component placement device for populating substrates with the components, which are made ready in pockets in a belt, comprising: inserting the belt into a feed module which delivers the components to a pick-up point in a defined pick-up position; removing the components from the pockets with a freely positionable component placement head; determining a location of centering marks in an area of the pick-up point using an image processing evaluation unit belonging to the component placement device; moving position-resolving scanning optics of the component placement head over the centering marks in the area of the pick-up point; aiming the scanning optics directly at the pockets; directly scanning the structural features of the pocket serving as the centering marks; and calculating, utilizing the image evaluation unit, an average position of the pockets from a position of the structural features.

The structural features associated with the pockets, for example the edges of the pockets, are now independent of the positional relationship with respect to the transport holes and the centering marks. The scanning optics has such a large field of view that, even with the first setting, it safely finds the pocket and its surrounding area. The position-resolving scanning optics transmits the measured values to the electrical evaluation unit, which calculates the accurate center position of the pockets from the appropriate data. The suction gripper can then immediately be aligned reliably on the component to be picked up.

All the positional tolerances between the component placement device and the centering marks and between the centering marks and the transport pins and between the transport pins and the pockets are therefore unimportant, and the suction gripper can be aligned with the center of the component with high accuracy without a failed attempt. The component is then removed reliably. The placement operation can then begin without further time delay.

It is particularly advantageous to measure the position of the adjacent pocket, which has already become free, which is free of the interfering features of the component. In this case, it is possible to assume that the positional deviation of the immediately following pocket is negligibly low. Since the pocket already emptied is not reached by the covering slider, the pocket is accessible at any time for optical scanning. A further advantage is that, as a rule, the first pockets in a belt are left free of components so that no component has to be removed for the measurement.

The belts and the components can have very variable optical characteristics. For example, the belts can consist of transparent material. For this reason, it may be necessary to select different structural features, depending on the type of belt. Advantageous developments of the invention are identified below.

It is particularly beneficial in this case to determine the edges of the pockets In particular, in the case of very small components, it is usual to punch the pockets out of a flat material and to close them at the bottom using a film. These punched pockets have sharp defined edges, which represent structural features that can be distinguished easily.

One inventive development makes it possible to adjust the illumination of the structural features to different conditions, as is also done when scanning centering marks on the substrates. The illumination makes it possible to illuminate the pockets from different directions at different angles and with different wavelengths, so that the structural features can stand out optimally.

The object of the invention is also achieved by a device for determining the pick-up position of electrical components in a component placement device for populating substrates with the components, which are made ready in pockets in a belt, comprising: scanning optics; a control unit belonging to the component placement device comprising a controller configured to position the scanning optics over a pocket; a communications mechanism configured to transmit type data about the component belt to the control unit; and a positioning mechanism configured to move the scanning optics over structural features of the belt by using the type data; and an image evaluation unit configured to detect and process different structural features of various belt types.

The inventive device makes it possible to register the different structural features of the various belt types automatically, each full belt which differs from the others in terms of its optical and geometric characteristics being assigned to its own type.

The inventive device may also comprise a control system for an illuminator of the component placement device. An adaptation module may permit optimal adaptation to the different optical conditions of the belts; this may be a self-teaching adaptation module connected to the control system for the illuminator and the image evaluation unit, the adaptation module configured to adjust the illuminator to provide a sufficient contrast effect of the structural features.

These inventive developments are explained in more detail below.

DESCRIPTION OF THE DRAWINGS

In the following text, the invention is explained in more detail using an exemplary embodiment illustrated in the drawings.

FIG. 1 is a schematic side view of a component placement head and a feed module in a component belt; and FIG. 2 is a plan view of the feed module according to FIG. 1.

DETAILED DESCRIPTION OF THE INVENTION

According to FIGS. 1 and 2, a strip-like belt 1 is provided with lateral transport holes 2 and pockets 3 for components 4 laid within, and is inserted into a disk-like flat feed module 5 which is fixed in a defined position in the range of movement of a component placement head 6 of a component placement device. The feed module 5 has a pin wheel 7 which can be driven in a stepwise manner and has transport pins 8 which stand out peripherally and engage without play in the transport holes 2 in the belt 1. The positional relationship between the pockets and the transport holes is defined by relevant standards. However, the permissible tolerances here are virtually as great as the lateral dimensions of the smallest components.

On its underside, facing the belt, the component placement head has a suction gripper 9 and scanning optics 10 in the form of a CCT camera, whose objective is surrounded by an illuminator 11 which illuminates the field of view of the scanning optics 10. The illuminator 11 can, for example, comprise a large number of light-emitting diodes of different wavelengths and different orientations. Matching the various belt types, it is possible to activate a beneficial selection of the diodes in such a way that the structural features stand out with good contrast and can be detected reliably.

The scanning optics 10 are aimed at a pick-up point 12 of the components in the feed module 5. It is capable of detecting structural features 14, for example the edges of an empty pocket. It is connected to an image evaluation unit 13, in which the central position of the pocket 3 is calculated by using this data, so that the following component 4 (a single component 4 only in the pocket 3) can be gripped reliably by the suction gripper, all the tolerances being eliminated.

The position of the pocket 3 in relation to the transport hole can change over a relatively long section of the belt. In a further optical scanning unit, not illustrated, the position of the components removed on the suction gripper 9 is measured accurately in order to increase the placement accuracy. In this way, the sliding positional change of the pockets can be registered reliably and taken into account during operation in such a way that remeasurement of the belt 1 with the aid of the scanning optics 10 might only be required following a loss of data on the component placement device, for example following an interruption.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

The invention claimed is:

1. A method of determining a pick-up position of electrical components in a component placement device for populating substrates with the components, which are made ready in pockets in a belt, comprising the steps of:
    providing only one component in each of said pockets of the belt;
    inserting the belt into a feed module which delivers the components to a pick-up point in a defined pick-up position;
    determining a location of a pocket center by using an image processing evaluation unit belonging to the component placement device, wherein the determining of the location comprises:
    moving position-resolving scanning optics of the component placement head over an area of the pick-up point;
    aiming the scanning optics at the pockets;
    directly scanning structural features of the pocket;
    calculating, utilizing the image evaluation unit, a central position of the pockets from a position of the structural features;
    the method further comprising:
    removing the one component only from each of the respective pockets with a freely positionable component placement head utilizing the determined location of the pocket center.

2. The method as claimed in claim 1, further comprising detecting the edges of the pocket.

3. The method as claimed in claim 1, further comprising:
    providing an illuminator to the scanning optics; and
    adapting variable optical characteristics of the illuminator to different component belts.

4. The method as claimed in claim 3, further comprising:
    controlling the illuminator with an illuminator control system; and
    adjusting the illuminator with a self-teaching adaptation module connected to the control system for the illuminator and the image evaluation unit, to provide a sufficient contrast effect of the structural features.

5. The method as claimed in claim 1, wherein a control unit belonging to the component placement device aims the scanning optics.

6. The method as claimed in claim 5, further comprising:
    transmitting data related to the structural features of a component belt to the control unit with a communications mechanism.

7. The method according to claim 1, wherein determining the location of the pocket center comprises determining the center location of an empty pocket.

8. The method as claimed in claim 7, further comprising detecting the edges of the pocket.

9. The method as claimed in claim 7, further comprising:
    providing an illuminator to the scanning optics; and
    adapting variable optical characteristics of the illuminator to different component belts.

10. The method as claimed in claim 9, further comprising:
    controlling the illuminator with an illuminator control system; and
    adjusting the illuminator with a self-teaching adaptation module connected to the control system for the illuminator and the image evaluation unit, to provide a sufficient contrast effect of the structural features.

11. The method as claimed in claim 7, wherein a control unit belonging to the component placement device aims the scanning optics.

12. The method as claimed in claim 11, further comprising:
    transmitting data related to the structural features of a component belt to the control unit with a communications mechanism.

13. The method as claimed in claim 1, wherein the removing of a component from a pocket is from a different pocket than the pocket whose center is determined.

14. The method as claimed in claim 13, wherein the pocket from which the component is removed is from an adjacent pocket whose center is determined.

* * * * *